(12) United States Patent
Karasawa

(10) Patent No.: US 11,512,200 B2
(45) Date of Patent: Nov. 29, 2022

(54) RESIN COMPOSITION, RESIN SHEET, LAMINATE, AND SEMICONDUCTOR ELEMENT

(71) Applicant: LINTEC CORPORATION, Tokyo (JP)

(72) Inventor: Yasunori Karasawa, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 546 days.

(21) Appl. No.: 16/494,215

(22) PCT Filed: Aug. 31, 2017

(86) PCT No.: PCT/JP2017/031353
§ 371 (c)(1),
(2) Date: Sep. 13, 2019

(87) PCT Pub. No.: WO2018/168005
PCT Pub. Date: Sep. 20, 2018

(65) Prior Publication Data
US 2020/0131365 A1 Apr. 30, 2020

(30) Foreign Application Priority Data

| Mar. 13, 2017 | (JP) | JP2017-047774 |
| Jun. 30, 2017 | (JP) | JP2017-129400 |
| Jun. 30, 2017 | (JP) | JP2017-129401 |
| Jun. 30, 2017 | (JP) | JP2017-129402 |

(51) Int. Cl.
| *B32B 27/28* | (2006.01) |
| *B32B 7/06* | (2019.01) |
| *H01L 23/29* | (2006.01) |
| *C09J 179/08* | (2006.01) |
| *C09J 171/10* | (2006.01) |
| *C09J 7/40* | (2018.01) |
| *C09J 7/30* | (2018.01) |
| *C08L 79/08* | (2006.01) |
| *C08L 71/10* | (2006.01) |
| *C08K 3/36* | (2006.01) |
| *C08L 71/12* | (2006.01) |
| *C08K 3/22* | (2006.01) |

(52) U.S. Cl.
CPC ............... *C08L 79/08* (2013.01); *B32B 7/06* (2013.01); *B32B 27/281* (2013.01); *B32B 27/285* (2013.01); *C08K 3/36* (2013.01); *C08L 71/12* (2013.01); *H01L 23/295* (2013.01); *B32B 2457/00* (2013.01); *C08K 2003/2227* (2013.01)

(58) Field of Classification Search
None
See application file for complete search history.

(56) References Cited

U.S. PATENT DOCUMENTS

| 2002/0140063 | A1* | 10/2002 | Yamazaki | H01L 24/29 257/668 |
| 2010/0193961 | A1* | 8/2010 | Konishi | C08L 83/00 257/773 |
| 2011/0187009 | A1* | 8/2011 | Masuko | H01L 24/27 523/435 |

FOREIGN PATENT DOCUMENTS

| CN | 1957452 A | 5/2007 |
| CN | 100501912 C | 6/2009 |
| CN | 102112568 A | 6/2011 |
| CN | 101939396 B | 11/2012 |
| CN | 103289628 A | 9/2013 |
| CN | 103802409 A | 5/2014 |
| CN | 104684996 A | 6/2015 |
| EP | 1783828 A1 | 5/2007 |
| JP | 2005-032961 A | 2/2005 |
| JP | 2005-340520 A | 12/2005 |
| JP | 2010-278324 A | 12/2010 |
| JP | 5195454 B2 | 5/2013 |
| JP | 2013-170266 A | 9/2013 |
| JP | 2014-080557 A | 5/2014 |
| JP | 2014-111719 A | 6/2014 |
| JP | 2015-147849 A | 8/2015 |
| JP | 2015-196803 A | 11/2015 |
| TW | 200603420 A | 1/2006 |
| WO | 2015/151815 A1 | 10/2015 |

OTHER PUBLICATIONS

International Preliminary Report on Patentability issued in International Patent Application No. PCT/JP2017/031353, dated Sep. 17, 2019.
Chinese Office Action issued in corresponding Chinese Patent Application No. 201780088405.7, dated Mar. 2, 2021, with English translation.
International Search Report issued in corresponding International Patent Application No. PCT/JP2017/031353, dated Nov. 21, 2017, with English translation.
Taiwanese Office Action issued in corresponding Taiwanese Patent Application No. 107108004, dated Jul. 6, 2021, with English translation.
Japanese Office Action issued in corresponding Japanese Patent Application No. 2020-183914, dated Aug. 31, 2021, with English translation.
"Organic Abrasive Manufacturing (first edition)", Editor-in-chief Zou Wenjun, pp. 151-153, China Standard Press, Sep. 30, 2001. The concise explanation of relevance is found in the Office Action at p. 3.

(Continued)

*Primary Examiner* — Michael J Feely
(74) *Attorney, Agent, or Firm* — McDermott Will & Emery LLP

(57) ABSTRACT

A resin composition contains a (A) thermoplastic component, a (B) thermosetting component, and a (C) inorganic filler, 5%-weight-reduction temperature of a hardened substance of the resin composition being 440 degrees C. or more.

11 Claims, 1 Drawing Sheet

(56) References Cited

OTHER PUBLICATIONS

Chinese Office Action issued in corresponding Chinese Patent Application No. 201780088405.7, dated Nov. 1, 2021, with English translation.
Chinese Office Action issued in corresponding Chinese Patent Application No. 201780088405.7, dated Apr. 2, 2022, with English translation.

* cited by examiner

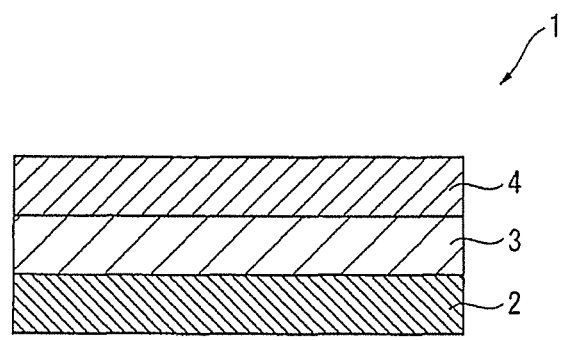

RESIN COMPOSITION, RESIN SHEET, LAMINATE, AND SEMICONDUCTOR ELEMENT

CROSS-REFERENCE OF RELATED APPLICATIONS

This application is the U.S. National Phase under 35 U.S.C. § 371 of International Patent Application No. PCT/JP2017/031353, filed on Aug. 31, 2017, which in turn claims the benefit of Japanese Application No. 2017-129402, filed Jun. 30, 2017, Japanese Application No. 2017-129401, filed Jun. 30, 2017, Japanese Application No. 2017-129400, filed Jun. 30, 2017, and Japanese Application No. 2017-047774, filed Mar. 13, 2017, the entire disclosures of which Applications are incorporated by reference herein.

TECHNICAL FIELD

The present invention relates to a resin composition, a resin sheet, a laminate, and a semiconductor device.

BACKGROUND ART

Adhesive sheets whose adhesive agent layer contains a resin composition have been known.

For instance, Patent Literature 1 discloses an adhesive film including a support member made of a resin such as polyethylene terephthalate, a resin composition layer formed on the support member, and a protection film (e.g. polypropylene film) for protecting the resin composition layer, which are layered in this order. The resin composition disclosed in Patent Literature 1 contains a polyfunctional epoxy resin, a hardening agent, a phenoxy resin, and an organic filler.

CITATION LIST

Patent Literature(s)

Patent Literature 1 Japanese Patent No. 5195454

SUMMARY OF THE INVENTION

Problem(s) to be Solved by the Invention

Recently, adhesive sheets have come to be used for manufacture of power semiconductor devices and the like. Heat resistance and adhesiveness are required for the resin composition used for the manufacture of power semiconductor devices.

An object of the invention is to provide a resin composition, a resin sheet, and a laminate capable of achieving higher heat resistance and adhesiveness than typical resin composition, resin sheet, and laminate. Another object of the invention is to provide a semiconductor device produced with the use of the resin composition or the resin sheet.

Means for Solving the Problem(s)

A resin composition according to an aspect of the invention contains: a (A) thermoplastic component; a (B) thermosetting component; and a (C) inorganic filler, where a 5%-weight-reduction temperature of a hardened substance of the resin composition is 440 degrees C. or more.

In the resin composition according to the above aspect of the invention, it is preferable that the (B) thermosetting component contains a bismaleimide resin.

In the resin composition according to the above aspect of the invention, it is preferable that the (B) thermosetting component further contains an allyl resin.

In the resin composition according to the above aspect of the invention, it is preferable that the (A) thermoplastic component contains a phenoxy resin.

In the resin composition according to the above aspect of the invention, it is preferable that the resin composition is used for installation of a semiconductor device.

In the resin composition according to the above aspect of the invention, it is preferable that the semiconductor device is a power semiconductor device.

In the resin composition according to the above aspect of the invention, it is preferable that the semiconductor device is a semiconductor device produced with a use of at least one of silicon carbide or gallium nitride.

A resin sheet according to another aspect of the invention is made of the resin composition according to the above aspect of the invention.

In the resin sheet according to the above aspect of the invention, it is preferable that the (B) thermosetting component in the resin composition contains a bismaleimide resin.

In the resin sheet according to the above aspect of the invention, it is preferable that the (B) thermosetting component in the resin composition contains a bismaleimide resin and an allyl resin.

In the resin sheet according to the above aspect of the invention, it is preferable that the (A) thermoplastic component contains a phenoxy resin.

In the resin sheet according to the above aspect of the invention, it is preferable that the resin sheet is used for installation of a semiconductor device.

In the resin sheet according to the above aspect of the invention, it is preferable that the semiconductor device is a power semiconductor device.

In the resin sheet according to the above aspect of the invention, it is preferable that the semiconductor device is a semiconductor device produced with a use of at least one of silicon carbide or gallium nitride.

A laminate according to still another aspect of the invention contains the resin sheet according to the above aspect of the invention; and a release material, where the release material includes a releasing agent layer made of an alkyd resin releasing agent.

In the laminate according to the above aspect of the invention, it is preferable that the laminate is used for installation of a semiconductor device.

In the laminate according to the above aspect of the invention, it is preferable that the laminate is used for installation of a semiconductor device and the semiconductor device is a power semiconductor device.

In the laminate according to the above aspect of the invention, it is preferable that the laminate is used for installation of a semiconductor device and the semiconductor device is a semiconductor device produced with a use of at least one of silicon carbide or gallium nitride.

A semiconductor device according to a further aspect of the invention is produced with a use of the resin composition according to the above aspect of the invention.

A semiconductor device according to a still further aspect of the invention is produced with a use of the resin sheet according to the above aspect of the invention.

A semiconductor device according to a still further aspect of the invention is produced with a use of the resin composition according to the above aspect of the invention and at least one of silicon carbide or gallium nitride.

A semiconductor device according to a still further aspect of the invention is produced with a use of the resin sheet according to the above aspect of the invention and at least one of silicon carbide or gallium nitride.

According to the above aspects of the invention, a resin composition with higher heat resistance and adhesiveness than typical resin composition, a resin sheet with higher heat resistance and adhesiveness than typical resin sheet, and a laminate with higher heat resistance and adhesiveness than typical laminate can be provided. Further, according to the above aspects of the invention, a semiconductor device produced with the use of the resin composition or the resin sheet can be provided.

BRIEF DESCRIPTION OF DRAWING(S)

The FIGURE is a schematic cross section of a laminate according to an exemplary embodiment.

DESCRIPTION OF EMBODIMENT(S)

Resin Composition

A resin composition according to an exemplary embodiment contains a (A) thermoplastic component, a (B) thermosetting component, and a (C) silica filler.

(A) Thermoplastic Component

The (A) thermoplastic component (sometimes simply referred to as "(A) component" hereinafter) is not particularly limited.

The (A) thermoplastic component according to the exemplary embodiment contains a thermoplastic resin.

The thermoplastic resin is, for instance, preferably at least one resin selected from the group consisting of a phenoxy resin, acrylic resin, methacrylic resin, polyester resin, and urethane resin, more preferably a phenoxy resin. The phenoxy resin is excellent in alkali resistance. Accordingly, when the resin composition according to the exemplary embodiment is used in a process of installing semiconductor devices including a treatment with an alkaline chemical, the resin composition is unlikely to be dissolved and the shape of the resin composition is easily maintained. The thermoplastic resin may be a single one or a combination of two or more of the above resins.

The phenoxy resin is preferably a phenoxy resin including at least one skeleton selected from the group consisting of a bisphenol A skeleton (bisphenol A will be sometimes abbreviated as "BisA" hereinafter), a bisphenol F skeleton (bisphenol F will be sometimes abbreviated as "BisF" hereinafter), a biphenyl skeleton, and a naphthalene skeleton, and is more preferably a phenoxy resin including the bisphenol A skeleton and the bisphenol F skeleton.

The weight average molecular weight (Mw) of the thermoplastic resin is preferably in a range from 100 to 1000000, more preferably from 1000 to 800000, and further preferably from 10000 to 100000. The weight average molecular weight herein is a value in terms of standard polystyrene measured through GPC (Gel Permeation Chromatography).

In the exemplary embodiment, a content of the (A) thermoplastic component in the resin composition is preferably in a range from 0.1 mass % to 50 mass % of a total mass of a solid content of the resin composition (i.e. of 100 mass % of the total dissolved solid in the resin composition except for solvent), more preferably in a range from 1 mass % to 40 mass %.

(B) Thermosetting Component

The (B) thermosetting component (sometimes simply referred to as "(B) component" hereinafter) is a component that forms a three-dimensional network upon being heated to bind adherends tightly. The thermosetting component in the exemplary embodiment is not particularly limited and typically known various thermosetting components are usable.

The (B) thermosetting component according to the exemplary embodiment contains a thermosetting resin and a hardening agent.

Any thermosetting resin with high heat resistance is usable. Examples of such thermosetting resin include bismaleimide resin, benzoxazine resin, cyanate resin, and melamine resin. The thermosetting resin may be a single one or a combination of two or more of the above resins.

Examples of the hardening agent include resins such as phenol resin and a resin including a C=C double bond, amines, acid anhydrides, and formaldehyde. Examples of the resin including a C=C double bond include allyl resin. The hardening agent may be a single one or a combination of two or more of the above examples.

Examples of the combination of the thermosetting resin and the hardening agent include a combination of the bismaleimide resin and allyl resin, a combination of the benzoxazine resin and phenol resin, a combination of the cyanate resin and phenol resin, a combination of the cyanate resin and an amine, a combination of the cyanate resin and acid anhydride, and a combination of the melamine resin and formaldehyde. In view of its high heat resistance, the combination of the bismaleimide resin and allyl resin is preferable.

In view of heat resistance, the (B) thermosetting component preferably contains the bismaleimide resin and allyl resin.

Typically known various bismaleimide resins and allyl resins are usable as the bismaleimide resin and the allyl resin.

The bismaleimide resin in the exemplary embodiment is preferably a bismaleimide resin having a substituent in view of solubility to solvent. Examples of the substituent include an alkyl group. The alkyl group is preferably an alkyl group having 1 to 6 carbon atoms, more preferably an alkyl group selected from the group consisting of methyl group and ethyl group.

The bismaleimide resin in the exemplary embodiment is also preferably a maleimide resin including two or more maleimide groups and two or more phenylene groups in one molecule. In order to enhance solubility to solvent and sheet-formability, it is preferable that a substituent is present on at least one of the phenylene groups. Examples of the substituent include an alkyl group such as methyl group and ethyl group, and an alkylene group.

An example of the maleimide resin in the exemplary embodiment is a maleimide resin in which the maleimide group and the phenylene group are directly bonded.

Another example of the maleimide resin in the exemplary embodiment is a maleimide resin including an ether bond between the maleimide group and the phenylene group in view of sheet-formability.

The bismaleimide resin in the exemplary embodiment is more preferably represented by a formula (1) below.

Formula 1

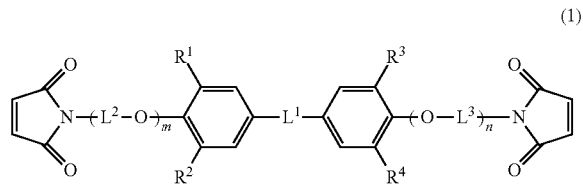

(1)

In the formula (1), $R^1$ to $R^4$ each independently represent a hydrogen atom or an alkyl group having 1 to 6 carbon atoms, $L^1$ is an alkylene group having 1 to 6 carbon atoms, $L^2$ and $L^3$ are each independently an alkylene group having 1 to 6 carbon atoms or an arylene group having 6 to 10 carbon atoms, and m and n each independently represent 0 or 1.

The maleimide resin represented by the formula (1) in the exemplary embodiment is specifically represented by a formula (1A) or a formula (1B) below.

Formula 2

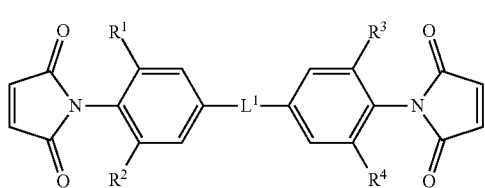

(1A)

Formula 3

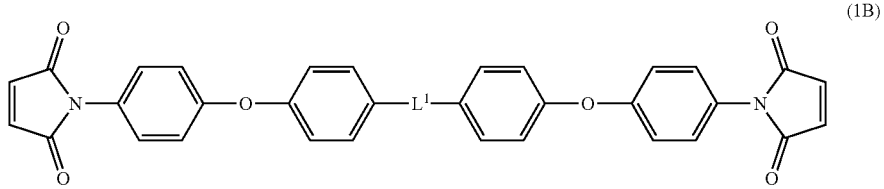

(1B)

In the formulae (1A) and (1B), $L^1$ is an alkylene group having 1 to 6 carbon atoms.

In the formula (1A), $R^1$ to $R^4$ each independently represent a hydrogen atom or an alkyl group having 1 to 6 carbon atoms.

$R^1$ to $R^4$ are preferably each independently an alkyl group having 1 to 2 carbon atoms.

$R^1$ and $R^2$ are preferably mutually different alkyl groups.

$R^3$ and $R^4$ are preferably mutually different alkyl groups.

It is more preferable that $R^1$ and $R^2$ are mutually different alkyl groups and $R^3$ and $R^4$ are mutually different alkyl groups.

Specifically, in order to, for instance, obtain hardened substance with high heat resistance, the bismaleimide resin in the exemplary embodiment is preferably 4,4'-diphenylmethanedimaleimide, bis(3-ethyl-5-methyl-4-maleimidephenyl)methane, —N,N'-1,3-phenylenedimaleimide, 4-methyl-1,3-phenylenebismaleimide, polyphenylmethanemaleimide, or 2,2-bis[4-(4-maleimidephenoxy)phenyl]propane, among which bis(3-ethyl-5-methyl-4-maleimidephenyl)methane is more preferable in terms of solubility to solvent.

Examples of the benzoxazine resin in the exemplary embodiment include at least one benzoxazine resin selected from a compound having a benzoxazine ring in a molecule (sometimes referred to as a "benzoxazine compound" hereinafter) and a ring-opened polymer of the benzoxazine compound. In view of reactivity and crosslinking density, the benzoxazine compound preferably includes two or more benzoxazine rings in one molecule. In other words, preferable examples of the benzoxazine resin include bisphenol-A benzoxazine compound, bisphenol-F benzoxazine compound, thiodiphenol benzoxazine compound, phenolphthalein benzoxazine compound, and dicyclopentadiene benzoxazine compound. The benzoxazine resin may be a single one or a combination of two or more of the above compounds.

Examples of the cyanate resin in the exemplary embodiment include a compound having two or more isocyanate groups in one molecule. Specific examples of the cyanate resin include a novolac cyanate resin, bisphenol cyanate resin such as bisphenol-A cyanate resin, bisphenol-E cyanate resin, and tetramethylbisphenol-F cyanate resin, and a prepolymer in which a part of the cyanate resin is turned into triazine. The cyanate resin may be a single one or a combination of two or more of the above resins.

Specific examples of the melamine resin in the exemplary embodiment include monomethoxymethylated melamine resin, dimethoxymethylated melamine resin, trimethoxymethylated melamine resin, tetramethoxymethylated melamine resin, pentamethoxymethylated melamine resin, hexamethoxymethylated melamine resin, butylated melamine resin, monomethylol melamine resin, dimethylol melamine resin, trimethylol melamine resin, tetramethylol melamine resin, pentamethylol melamine resin, hexamethylol melamine resin, and imino-group-containing methoxymethylated melamine resin. The melamine resin may be a single one or a combination of two or more of the above resins.

The allyl resin in the exemplary embodiment is not particularly limited as long as the resin include an allyl group. The allyl resin in the exemplary embodiment is preferably an allyl resin including two or more allyl groups in one molecule.

The allyl resin in the exemplary embodiment is more preferably represented by a formula (2) below.

Formula 4

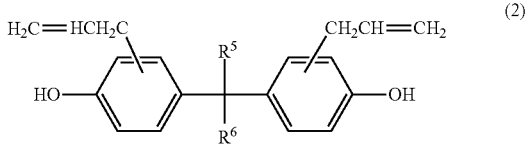
(2)

In the formula (2), $R^5$ and $R^6$ are each independently an alkyl group, preferably an alkyl group having 1 to 10 carbon atoms, more preferably an alkyl group having 1 to 4 carbon atoms, and further preferably an alkyl group selected from the group consisting of methyl group and ethyl group.

Specific examples of the allyl resin include diallylbisphenol A.

In order to enhance heat resistance, the (B) thermosetting component in the exemplary embodiment preferably contains bis(3-ethyl-5-methyl-4-maleimidephenyl)methane and diallylbisphenol A.

The phenol resin in the exemplary embodiment is not particularly limited and typically known phenol resin is usable. The phenol resin in the exemplary embodiment is in a form of a monomer, oligomer, polymer or the like having two or more phenolic hydroxyl groups in one molecule. Examples of the phenol resin in the exemplary embodiment include novolac phenol resin, cresol novolac phenol resin, naphthol novolac phenol resin, phenol aralkyl epoxy resin, phenol benzylaldehyde epoxy resin, biphenyl phenol resin, bisphenol-A phenol resin, bisphenol-F phenol resin, and dicyclopentadiene phenol resin. The phenol resin may be a single one or a combination of two or more of the above resins.

Examples of the amine in the exemplary embodiment include diamines such as ethylenediamine, 1,2-propanediamine, 1,6-hexamethylenediamine, piperazine, 2,5-dimethylpiperazine, (isophoronediamine, 4,4'-dicyclohexylmethanediamine, and 1,4-cyclohexanediamine; polyamines such as diethylenetriamine, dipropylenetriamine, and triethylenetetramine; hydrazines such as hydrazine, N,N'-dimethylhydrazine, and 1,6-hexamethylenebishydrazine; and dihydrazides such as succinic dihydrazide, adipic dihydrazide, glutalic dihydrazide, sebacic dihydrazide, and isophthalic dihydrazide. The amine may be a single one or a combination of two or more of the above amines.

Examples of the acid anhydride in the exemplary embodiment include maleic anhydride, succinic anhydride, alkenyl succinic anhydride, phthalic anhydride, cyclopentane-1,2-dicarboxylic anhydride, hexahydro phthalic anhydride, 1,2,3,6-tetrahydro phthalic anhydride, 3,4,5,6-tetrahydro phthalic anhydride, hexahydro phthalic anhydride, 4-methyl hexahydro phthalic anhydride, 4-phenylethynylphthalic anhydride, trimellitic anhydride, cyclohexane-1,2,4-tricarboxylic-1,2-anhydride, nadic anhydride, methyl nadic anhydride, bicyclo[2,2,1]heptane-2,3-dicarboxylic anhydride, methylbicyclo[2,2,1]heptane-2,3-dicarboxylic anhydride, methyl-3,6-endomethylene-1,2,3,6-tetrahydro phthalic anhydride, 2,3-naphthalene dicarboxylic anhydride, 1,8-naphthalene dicarboxylic anhydride, 2,3-anthracene dicarboxylic anhydride, copolymer of styrene-maleic anhydride, copolymer of olefin-maleic anhydride, and copolymer of methylvinylether-maleic anhydride. Examples of acid dianhydride include ethylenetetracarboxylic dianhydride, pyromellitic anhydride, 1,2,3,4-butanetetracarboxylic dianhydride, 1,2,3,4-pentanetetracarboxylic dianhydride, 4,4'-oxydiphthalic anhydride, 3,3',4,4'-benzophenonetetracarboxylic dianhydride, 3,3',4,4'-biphenyltetracarboxylic dianhydride, 3,3',4,4'-diphenylsulfone tetracarboxylic dianhydride, ethyleneglycol bistrimellitate dianhydride, glycerin bistrimellitate dianhydride monoacetate, p-phenylenebis (trimellitate anhydride), 5-(2,5-dioxotetrahydrofuryl)-3-methyl-3-cyclohexene-1,2-carboxylic dianhydride, 5-(2,5-dioxotetrahydrofuryl)-3-cyclohexene-1,2-carboxylic dianhydride, bicyclo[2,2,2]oct-7-en-2,3,5,6-tetracarboxylic anhydride, 1,2,3,4-cyclobutanetetracarboxylic dianhydride, 2,3,6,7-naphthalenetetracarboxylic dianhydride, and 1,4,5,8-naphthalenetetracarboxylic dianhydride. The acid anhydride and acid dianhydride may be a single one or a combination of two or more of the above anhydrides.

The formaldehyde in the exemplary embodiment may be a formaldehyde condensate, or a formaldehyde aqueous solution. Examples of the formaldehyde condensate include trioxane, and paraformaldehyde. Examples of the formaldehyde aqueous solution include formalin.

In the exemplary embodiment, a content of the (B) thermosetting component in the resin composition is preferably in a range from 2 mass % to 75 mass % of the total mass of the solid content of the resin composition (i.e. of 100 mass % of the total dissolved solid in the resin composition except for solvent), more preferably 5 mass % to 70 mass %.

In the exemplary embodiment, when the (B) thermosetting component contains the bismaleimide resin and allyl resin, the content of the bismaleimide resin in the resin composition is preferably in a range from 2 mass % to 75 mass % of the total mass of the solid content of the resin composition (i.e. of 100 mass % of the total dissolved solid in the resin composition except for solvent), more preferably 5 mass % to 70 mass %. At the bismaleimide resin content within the above range, the heat resistance of the resin composition is improvable and the solubility to solvent is excellent.

It is preferable for the hardening agent in a form of the allyl resin to be contained at a ratio in a range from 10 parts by mass to 200 parts by mass to 100 parts by mass of the bismaleimide resin, more preferably in a range from 20 parts by mass to 150 parts by mass. At the ratio of the allyl resin within the above range, shearing strength is improvable.

In the exemplary embodiment, the (B) thermosetting component optionally contains a hardening accelerator.

Examples of the hardening accelerator include imidazole compound. Examples of the imidazole compound include 2-ethyl-4-methylimidazole.

A content of the hardening accelerator in the resin composition is preferably in a range from 0.005 mass % to 12 mass % of the total mass of the solid content of the resin composition (i.e. of 100 mass % of the total dissolved solid in the resin composition except for solvent), more preferably 0.01 mass % to 10 mass %.

In the exemplary embodiment, it is also preferable that the (B) thermosetting component contains the bismaleimide resin and the allyl resin and contains no epoxy resin.

(C) Inorganic Filler

A (C) inorganic filler (sometimes simply referred to as "(C) component" hereinafter) provides heat resistance to the resin composition.

Examples of the (C) inorganic filler include silica filler, alumina filler, and boron nitride filler, among which silica filler is preferable.

Examples of the silica filler include molten silica and spherical silica.

The (C) inorganic filler may be a single one or a combination of two or more of the above examples.

The (C) inorganic filler may be surface-treated.

The average particle size of the (C) inorganic filler is not particularly limited. The average particle size of the (C) inorganic filler is preferably in a range from 0.1 nm to 10 μm in a measurement with a typical particle size distribution analyzer. The average particle size of the (C) inorganic filler is measured herein through dynamic light scattering with a particle size distribution analyzer (product name "Nanotrac Wave-UT151" manufactured by Nikkiso Co., Ltd.).

The content of the (C) inorganic filler in the resin composition is preferably in a range from 10 mass % to 90 mass % of the total mass of the solid content of the resin composition (i.e. of 100 mass % of the total dissolved solid in the resin composition except for solvent), more preferably 20 mass % to 80 mass %. At the content of the (C) inorganic filler within the above range, heat resistance of the resin composition is further improvable.

An example of the resin composition according to the exemplary embodiment consists solely of the (A) thermoplastic component, the (B) thermosetting component, and the (C) inorganic filler.

Another example of the resin composition according to the exemplary embodiment contains the (A) thermoplastic component, the (B) thermosetting component, the (C) inorganic filler, and component(s) other than the (A) to (C) components, as described below.

(D) Coupling Agent

In the exemplary embodiment, it is preferable that the resin composition contains a (D) coupling agent in addition to the (A) to (C) components.

The coupling agent preferably includes a group reactive with a functional group of the (A) thermoplastic component or a functional group of the (B) thermosetting component, more preferably a group reactive with the functional group of the (B) thermosetting component.

It is believed that an organic functional group in the (D) coupling agent reacts with the (B) thermosetting component (preferably maleimide resin) during a hardening reaction of the resin composition. The use of the (D) coupling agent can improve adhesiveness, sealability, and waterproofness (resistance to moist and heat) without impairing the heat resistance of the hardened substance.

The (D) coupling agent is preferably a silane coupling agent in view of its versatility, cost advantage, and the like.

The above (D) coupling agent is usually added at a ratio in a range from 0.1 parts by mass to 20 parts by mass, preferably 0.3 parts by mass to 15 parts by mass, more preferably 0.5 parts by mass to 10 parts by mass with respect to 100 parts by mass of the (B) thermosetting component.

Other Component(s)

The resin composition in the exemplary embodiment may contain other additional component(s). Examples of the other components include at least one component selected from the group consisting of a cross-linker, pigment, dye, antifoaming agent, leveling agent, UV absorber, foaming agent, antioxidant, flame retardant, and ion scavenger.

For instance, the resin composition may additionally contain a cross-linker in order to control initial adhesiveness and cohesiveness before being hardened.

Examples of the cross-linker include organic polyvalent isocyanate compound and organic polyvalent imine compound.

Examples of the organic polyvalent isocyanate compound include an aromatic polyvalent isocyanate compound, aliphatic polyvalent isocyanate compound, alicyclic polyvalent isocyanate compound, trimer of these polyvalent isocyanate compounds, and isocyanate-terminal urethane prepolymer provided by reacting these polyvalent isocyanate compounds with a polyol compound.

Further specific examples of the organic polyvalent isocyanate compound include 2,4-tolylenediisocyanate, 2,6-tolylenediisocyanate, 1,3-xylylenediisocyanate, 1,4-xylenediisocyanate, diphenylmethane-4,4'-diisocyanate, diphenylmethane-2,4'-diisocyanate, 3-methyldiphenylmethane diisocyanate, hexamethylenediisocyanate, isophoronediisocyanate, dicyclohexylmethane-4,4'-diisocyanate, dicyclohexylmethane-2,4'-diisocyanate, and lysine isocyanate.

Specific examples of the organic polyvalent imine compound include N,N'-diphenylmethane-4,4'-bis(1-aziridine carboxyamide), trimethylol propane-tri-n-aziridinyl propionato, tetramethylol methane-tri-o-aziridinyl propionato, and N,N'-toluene-2,4-bis(1-aziridine carboxyamide)triethylenemelamine.

The above cross-linker is usually added at a ratio in a range from 0.01 parts by mass to 12 parts by mass, preferably 0.1 parts by mass to 10 parts by mass with respect to 100 parts by mass of the thermoplastic resin in the component (A).

A 5%-weight-reduction temperature of the hardened substance of the resin composition according to the exemplary embodiment is necessary to be 440 degrees C. or more. The 5%-weight-reduction temperature of the hardened substance refers to a temperature at which weight reduction, which is measured while raising a temperature of a measurement sample, reaches 5 wt % of the measurement sample. The 5%-weight-reduction temperature will be sometimes abbreviated as "Td5" hereinafter.

Td5 is preferably 445 degrees C. or more.

With Td5 of 440 degrees C. or more, the heat resistance of the resin composition is improvable.

It should be noted that Td5 herein is measured at a scanning speed of 10 degrees C./min., and in a temperature range from 50 degrees C. to 600 degrees C. using a simultaneous thermogravimetric analyzer (product name: DTG-60, manufactured by Shimadzu Corporation).

Resin Sheet

The resin sheet according to the exemplary embodiment is made of the resin composition according to the exemplary embodiment. Thus, Td5 of the resin sheet according to the exemplary embodiment is also 440 degrees C. or more.

The resin composition according to the exemplary embodiment is processed into a form of a sheet to form the resin sheet according to the exemplary embodiment. The sheet-shaped resin composition is easily applied onto an adherend, especially when the adherend is of a large size.

The sheet-shaped resin composition, which has been shaped into a form adaptable to some extent to a shape after a sealing process, can provide a sealing material with some degree of uniformity only by applying on a target. Further, the sheet-shaped resin composition, which has no fluidity, is excellent in handleability.

The process for shaping the resin composition into a sheet, which may be any of typically known processes, and is not particularly limited. The resin sheet according to the exemplary embodiment may be band-shaped and/or may be wound into a roll. The resin sheet according to the exemplary embodiment, which has been wound into a roll, may be unwound from the roll and, for instance, cut into a desired size for use.

The thickness of the resin sheet according to the exemplary embodiment is preferably 10 μm or more, more preferably 20 μm or more. Further, the thickness is preferably 500 μm or less, more preferably 400 μm or less, further preferably 300 μm or less.

The resin sheet according to the exemplary embodiment is preferably collectively applied to a plurality of semiconductor devices. For instance, when the resin composition is sheet-shaped, the resin sheet may be applied to a structure, which includes a frame with a plurality of spaces therein and semiconductor devices each provided in corresponding one of the spaces, to collectively seal the frame and the semiconductor devices (i.e. so-called panel level packaging).

Laminate

The resin sheet according to the exemplary embodiment may be provided in a form of a laminate. The FIGURE is a schematic cross-sectional view showing a laminate 1 (i.e. an example of the laminate) according to the exemplary embodiment.

The laminate 1 according to the exemplary embodiment includes a first release material 2, a second release material 4, and a resin sheet 3 provided between the first release material 2 and the second release material 4. The resin sheet 3 is made of the resin composition according to the exemplary embodiment.

The first release material 2 and the second release material 4 have releasability. The materials of the first release material 2 and the second release material 4 are not particularly limited. It is preferable that a release force P1 of the first release material 2 with respect to the resin sheet 3 is different from a release force P2 of the second release material 4 with respect to the resin sheet 3. A ratio (P2/P1) of the release force P2 of the second release material 4 to the release force P1 of the first release material 2 is preferably $0.02 \leq P2/P1 < 1$ or $1 < P2/P1 \leq 50$.

The first release material 2 and the second release material 4 may be components made of inherently releasable materials. Alternatively, the first and second release materials 2, 4 may be components having been subjected to a release treatment, laminated with a releasing agent layer, or the like. Specific examples of the material for the first release material 2 and the second release material 4 include an olefin resin, fluorine resin, ester resin, and polyethylene terephthalate (PET) having been subjected to a release treatment. When the first release material 2 and the second release material 4 are not subjected to the release treatment, examples of the materials for the first release material 2 and the second release material 4 include an olefin resin and fluorine resin.

The first release material 2 and the second release material 4 optionally include a release base and a releasing agent layer formed by applying a releasing agent on the release base. The release material including the release base and the releasing agent layer is easily handled. The first and second release materials 2, 4 may include the releasing agent layer on only one of surfaces of the release base, or may include a releasing agent layer on both of the surfaces of the release base.

Examples of the release base include a paper base, a laminate paper including the paper base and a thermoplastic resin such as polyethylene laminated on the paper base, and a plastic film. Examples of the material of the paper base include glassine paper, coated paper, and cast-coated paper. Examples of the plastic film include polyester films such as polyethylene terephthalate film, polybutylene terephthalate film and polyethylene naphthalate film, and polyolefin films such as polypropylene film and polyethylene film. Among the plastic films, polyester film is suitably usable.

Examples of the releasing agent include a silicone releasing agent made of silicone resin; a long-chain-alkyl-group-containing-compound releasing agent made of a compound including a long-chain alkyl group (e.g. polyvinyl carbamate and alkyl urea derivative); an alkyd resin releasing agent made of an alkyd resin (e.g. non-convertible alkyd resin and convertible alkyd resin); olefin-resin releasing agent made of an olefin resin such as polyethylene (e.g. high-density polyethylene, low-density polyethylene, and linear low-density polyethylene) and crystalline polypropylene (e.g. propylene homopolymer with isotactic or syndiotactic structure, and propylene-α-olefin copolymer); rubber releasing agent such as a natural rubber and synthetic rubber (e.g. butadiene rubber, isoprene rubber, styrene-butadiene rubber, methyl-methacrylate-butadiene rubber, and acrylonitrile-butadiene rubber); and acrylic-resin releasing agent made of acrylic resin such as (meth)acrylate copolymer, a single one of or a combination of two or more of the above examples being usable as the releasing agent. In order to adjust the ratio (P2/P1) of the release force P2 of the second release material 4 to the release force P1 of the first release material 2 within the above range, the arrangement of the releasing agent used for the first release material 2 is preferably different from the arrangement of the releasing agent used for the second release material 4. In this case, for instance, the first release material 2 and the second release material 4 may be made of silicone releasing agents with different compositions, and/or the thickness of the releasing agent layer of the first release material 2 may be different from the thickness of the releasing agent layer of the second release material 4. Alternatively, the releasing agent of the first release material 2 and the releasing agent of the second release material 4 may be different in types. Specifically, for instance, the releasing agent of the first release material 2 may be an alkyd resin releasing agent, and the releasing agent of the second release material 4 may be a silicone releasing agent. Further, when the above-described resin composition contains phenoxy resin as the (A) thermoplastic component, the release film is liable to be peeled off. Accordingly, the releasing agent layer of one of the first release material 2 and the second release material 4 (e.g. the releasing agent layer of the first release material 2) is preferably made of a non-silicone releasing agent. The non-silicone releasing agent is selected from the group of the above examples of the releasing agents except for the silicone releasing agent. Among the above, the non-silicone releasing agent is preferably an alkyd resin releasing agent.

The thicknesses of the first release material 2 and the second release material 4 are not particularly limited. The thicknesses of the first release material 2 and the second release material 4 are usually in a range from 1 µm to 500 µm and are preferably in a range from 3 µm to 100 µm.

The thickness of the releasing agent layer is not particularly limited. When the releasing agent layer is formed by applying a solution containing the releasing agent, the thickness of the releasing agent layer is preferably in a range from 0.01 µm to 3 µm, more preferably in a range from 0.03 µm to 1 µm.

The method for producing the laminate 1 is not particularly limited. For instance, the laminate 1 is produced through the following steps. The resin composition is first applied on the first release material 2 to form a coating film. The coating film is then dried to form the resin sheet 3. Subsequently, the resin sheet 3 and the second release material 4 are adhered at a room temperature to produce the laminate 1.

The resin composition, the resin sheet or the laminate according to the exemplary embodiment is preferably used for installation of semiconductor device(s). The installation of the semiconductor device(s) includes at least one of sealing the semiconductor device(s), interposing the resin composition, the resin sheet or the laminate between the semiconductor device(s) and other electronic component(s), and forming a circuit for the semiconductor device(s).

The semiconductor device(s) is preferably a power semiconductor.

The resin composition, the resin sheet, or the laminate according to the exemplary embodiment is preferably used for sealing a semiconductor device produced with the use of at least one of silicon carbide or gallium nitride, or for being interposed between the semiconductor device produced with the use of at least one of silicon carbide or gallium nitride and the other electronic component. The resin composition according to the exemplary embodiment is more preferably used for a power semiconductor device produced with the use of at least one of silicon carbide or gallium nitride.

Examples of the other electronic component include a printed circuit board and a lead frame.

Semiconductor Apparatus

A semiconductor apparatus according to the exemplary embodiment includes a semiconductor device and the resin composition or the resin sheet according to the exemplary embodiment used for installation of the semiconductor device.

The semiconductor device is sealed with the use of the resin sheet according to the exemplary embodiment, for instance, as follows. A resin sheet is placed to cover the semiconductor device and is pressure-bonded through vacuum lamination to seal the semiconductor device.

When the laminate 1 of the exemplary embodiment is used, after releasing one of the release materials of the laminate 1, the resin sheet is placed to cover the semiconductor device. The other release material is then peeled off. Subsequently, a remainder of the laminate is pressure-bonded through vacuum lamination to seal the semiconductor device.

The semiconductor device is bonded to the other electronic component with the use of the resin composition or the resin sheet according to the exemplary embodiment, for instance, as follows. After the resin sheet is placed on the other electronic component, the semiconductor device is placed on the resin sheet. Subsequently, the resin sheet and the semiconductor device are temporarily pressure-bonded and the resin sheet is heated to be hardened. The resin composition is thus interposed between the semiconductor device and the other electronic component to bond the semiconductor device with the other electronic component.

The circuit for the semiconductor device is formed with the use of the resin composition or the resin sheet according to the exemplary embodiment through, for instance, a build-up process. The circuit may be formed on the substrate or may be directly formed on the semiconductor device.

Effect of Exemplary Embodiment(s)

The resin composition and resin sheet according to the exemplary embodiment exhibit improved heat resistance and adhesiveness. The use of the resin composition and the resin sheet according to the exemplary embodiment provides a sealing resin layer with higher heat resistance and adhesiveness than typical resin layers for sealing the semiconductor device, improving adhesion strength between the semiconductor device and the sealing resin layer.

The resin composition and the resin sheet according to the exemplary embodiment are suitably usable for installation of semiconductor devices, more suitably usable for installation of power semiconductor devices.

The resin composition and the resin sheet according to the exemplary embodiment are suitably usable for semiconductor devices produced with the use of at least one of silicon carbide or gallium nitride. The semiconductor devices produced with the use of at least one of silicon carbide or gallium nitride, which exhibit properties different from silicon semiconductors, are suitably usable for power semiconductors, high-power device for base station, sensors, detectors, and Schottky barrier diodes. For these applications, where the heat resistance of the semiconductor devices produced with the use of at least one of silicon carbide or gallium nitride is of interest, the resin composition and the resin sheet of the exemplary embodiment that are excellent in heat resistance are suitably usable in combination with the semiconductor devices produced with the use of at least one of silicon carbide or gallium nitride.

Modification(s)

The scope of the invention is not limited to the above exemplary embodiments, but includes modifications and improvements as long as the modifications and improvements are compatible with an object of the invention.

The laminate of the above exemplary embodiment includes the first release material, the second release material, and the resin sheet between the first release material and the second release material. However, the laminate includes a release material only on one side of the resin sheet in some embodiments of the invention.

Though the resin composition and the resin sheet are used in the semiconductor apparatus in the exemplary embodiment for the purpose of sealing the semiconductor devices, the resin composition and the resin sheet of the invention are also usable as an insulative material for circuit boards (e.g. hard printed circuit board material, flexible circuit board material, and interlayer insulation material for build-up boards), an adhesive film for build-up boards, an adhesive, and the like.

Examples

The invention will be described in further detail with reference to Example(s). It should be noted that the scope of the invention is by no means limited by Examples.

Preparation of Resin Composition

The materials used for preparing the resin composition were as follows.

Thermoplastic Component

Binder resin: BisA/BisF mixed phenoxy resin ("ZX-1356-2", manufactured by NIPPON STEEL & SUMIKIN CHEMICAL CO., LTD, weight average molecular weight: 65,000)

Thermosetting Component

BMI resin: bis(3-ethyl-5-methyl-4-maleimidephenyl) methane

Allyl resin: diallylbisphenol A

Epoxy resin: biphenyl epoxy resin ("NC3000H" manufactured by Nippon Kayaku Co., Ltd.)

Phenol resin: biphenyl phenol novolac resin ("MEH-7851-H" manufactured by MEIWA PLASTIC INDUSTRIES, LTD.)

Hardening accelerator: 2-ethyl-4-methylimidazole

Filler

Silica filler: molten silica (epoxy-silane-modified, average particle size 0.5 µm, maximum particle size 2.0 µm)

Other Additive
  Coupling agent: 3-glycidoxypropyltriethoxysilane
  Resin compositions according to Examples 1 to 4 and Comparative Example 1 were prepared at respective content ratios shown in Table 1 (mass % (ratios in terms of the solid contents)).
Hardening Conditions of Resin Composition
  The prepared resin compositions were heated at 200 degrees C. for four hours to prepare resin hardened substances.
Preparation of Resin Sheet
  A resin varnish (coating solution prepared by dissolving the resin composition in methyl ethyl ketone at a solid content concentration of 40 mass %) was applied with a die coater on the first release material (polyethylene terephthalate provided with a release layer formed of an alkyd resin releasing agent, thickness: 38 μm) so that the thickness of the resin composition after being dried became 20 μm, and dried at 100 degrees C. for two minutes. Immediately after being taken out of a drying furnace, the second release material (polyethylene terephthalate provided with a release layer formed of a silicone release material, thickness: 38 μm) and the dried resin composition were mutually stuck at a room temperature to prepare a laminate including the first release material, the resin layer (resin sheet) made of the resin composition, and the second release material that are layered in this order.
Td5
  Td5 of the resin hardened substance was measured under the conditions below with a simultaneous thermogravimetric analyzer (product name: DTG-60) manufactured by Shimadzu Corporation.
  Scanning speed: 10 degrees C./min
  Temperature range: 50 to 600 degrees C.
Evaluation of Bonding Strength
  One of the surfaces of the resin sheet was adhered on a polished surface (polished at #2000 grit size) of an Si mirror wafer that had been divided into a plurality of pieces (5 mm×5 mm, thickness 350 μm) at a laminate temperature of 60 degrees C. and the other of the surfaces of the resin sheet was pressure-bonded to a copper plate (5 mm×350 μm, specified in JIS H 3100). The pressure-bonding conditions were 250 gf/100 degrees C./3 sec. The first release material and the second release material laminated on the resin sheet were peeled off before being adhered on the Si mirror wafer and the copper plate, respectively. Subsequently (i.e. after the Si mirror wafer and the copper plate were stuck on the resin sheet), the resin composition was hardened under the above thermosetting conditions (200 degrees C., four hours), and the bonding strength was evaluated through measurement of a shearing strength with a shearing strength measuring machine (product name: Bondtester Dage4000, manufactured by Nordson Advanced Technology K.K.). The unit of the shearing strength was N/5 mm square.
  The evaluation was conducted under two conditions below.
  Condition 1: no moist heat
  Measurement temperature: 250 degrees C.
  Condition 2: with moist heat
  Measurement temperature: 250 degrees C.
  Moist heat condition: JEDEC Lv1 (85 degrees C./85% RH/168 hr)
  Table 1 shows the measurement results of Td5 and the shearing strength.

TABLE 1

| | Composition | | | | | | | | | | Evaluation results Properties of composition Shearing strength (N/5 mm sq.) | |
|---|---|---|---|---|---|---|---|---|---|---|---|---|
| | Thermosetting components | | | | | | | | | | Measurement Temperature: 250° C. | |
| | BMI resin | Allyl resin | Epoxy resin | Phenol resin | Hardening accelerator | Binder resin | Silica filler | Coupling agent | Total | Td5 (° C.) | No moist heat | With moist heat |
| Ex. 1 | 27.20 | 7.79 | — | — | — | 14.0 | 50.0 | 1.0 | 100.0 | 447 | 226 | 188 |
| Ex. 2 | 24.48 | 10.52 | — | — | — | 14.0 | 50.0 | 1.0 | 100.0 | 450 | 105 | 154 |
| Ex. 3 | 18.83 | 16.17 | — | — | — | 14.0 | 50.0 | 1.0 | 100.0 | 449 | 70 | 74 |
| Ex. 4 | 24.48 | 10.52 | — | — | — | 15.0 | 50.0 | — | 100.0 | 450 | 119 | 97 |
| Comp. 1 | — | — | 19.41 | 15.56 | 0.07 | 14.0 | 50.0 | 1.0 | 100.0 | 413 | 33 | 29 |

All of the resin compositions according to Examples 1 to 4 exhibited improved Td5 and shearing strength as compared with the resin composition according to Comparative Example 1, showing higher heat resistance and adhesiveness of the resin compositions according to Examples 1 to 4 than the resin composition according to Comparative Example 1.

The invention claimed is:
1. A resin composition comprising:
  a (A) thermoplastic component in a range from 0.1 mass % to 40 mass % of a total mass of a solid content of the resin composition;
  a (B) thermosetting component in a range from 5 mass % to 75 mass % of the total mass of the solid content of the resin composition; and
  a (C) inorganic filler in a range from 20 mass % to 90 mass % of the total mass of the solid content of the resin composition, wherein
  the (B) thermosetting component contains a bismaleimide resin and an allyl resin, and
  a 5%-weight-reduction temperature of a hardened substance of the resin composition is 440 degrees C. or more.
2. The resin composition according to claim 1, wherein the (A) thermoplastic component comprises a phenoxy resin.
3. The resin composition according to claim 2, wherein a weight average molecular weight of the phenoxy resin is 10000 to 100000.
4. The resin composition according to claim 1, wherein the (C) inorganic filler is molten silica.

5. A semiconductor device comprising the resin composition according to claim 1,
wherein the semiconductor device is a semiconductor device sealed with the resin composition, or a semiconductor device bonded to an electronic component via the resin composition.

6. A semiconductor device comprising the resin composition according to claim 1 and at least one of silicon carbide or gallium nitride,
wherein the semiconductor device is sealed with the resin composition, or bonded to an electronic component via the resin composition.

7. A resin sheet made of the resin composition according to claim 1.

8. The resin sheet according to claim 7, wherein the (A) thermoplastic component comprises a phenoxy resin.

9. A laminate comprising:
the resin sheet according to claim 7; and
a release material, wherein
the release material comprises a releasing agent layer made of an alkyd resin releasing agent.

10. A semiconductor device comprising the resin sheet according to claim 7,
wherein the semiconductor device is a semiconductor device sealed with the resin sheet, or a semiconductor device bonded to an electronic component via the resin sheet.

11. A semiconductor device comprising the resin sheet according to claim 7 and at least one of silicon carbide or gallium nitride,
wherein the semiconductor device is sealed with the resin sheet, or bonded to an electronic component via the resin sheet.

* * * * *